(12) United States Patent
Chng et al.

(10) Patent No.: US 8,094,509 B2
(45) Date of Patent: Jan. 10, 2012

(54) APPARATUS AND METHOD FOR PLACEMENT OF BOOSTING CELL WITH ADAPTIVE BOOSTER SCHEME

(75) Inventors: Chin-Ghee Chng, Gelugor (MY); Teoh Boon-Weng, Bayan Lepas (MY)

(73) Assignee: Spansion LLC, Sunnyvale, CA (US)

( * ) Notice: Subject to any disclaimer, the term of this patent is extended or adjusted under 35 U.S.C. 154(b) by 520 days.

(21) Appl. No.: 12/262,123

(22) Filed: Oct. 30, 2008

(65) Prior Publication Data

US 2010/0110819 A1    May 6, 2010

(51) Int. Cl.
*G11C 7/12* (2006.01)
*G11C 8/08* (2006.01)

(52) U.S. Cl. ............ 365/202; 365/189.09; 365/189.11; 365/185.18

(58) Field of Classification Search ............ 365/189.09, 365/189.11, 202, 206, 185.18
See application file for complete search history.

(56) References Cited

U.S. PATENT DOCUMENTS

| | | | | |
|---|---|---|---|---|
| 5,798,966 | A * | 8/1998 | Keeney | 365/185.18 |
| 6,980,045 | B1 * | 12/2005 | Liu | 327/536 |
| 7,532,518 | B2 * | 5/2009 | Yang et al. | 365/185.23 |
| 2002/0163376 | A1 * | 11/2002 | Pappalardo et al. | 327/536 |
| 2007/0070710 | A1 * | 3/2007 | Takenaka | 365/189.01 |
| 2010/0033262 | A1 * | 2/2010 | Puzella et al. | 333/33 |

* cited by examiner

*Primary Examiner* — J. H. Hur
(74) *Attorney, Agent, or Firm* — Frommer Lawrence & Haug LLP; Matthew M. Gaffney

(57) ABSTRACT

A memory includes memory arrays and boost converter circuitry. The boost converter circuitry provides at least one boosted voltage to each of the memory arrays when the memory array is being accessed. The boosted voltages may include a word line voltage, and/or a pass gate voltage provided to the gates of pass line transistor in a sector decoders and/or an array decoder for the memory cells being accessed. The boost converter circuitry includes at least two boost converters, and a switch. When one of the memory arrays is accessed, the switch either couples the boost converters together or does not couple the boost converters together based on the distance of the memory array being accessed from the boost converters.

10 Claims, 4 Drawing Sheets

APPARATUS AND METHOD FOR PLACEMENT OF BOOSTING CELL WITH ADAPTIVE BOOSTER SCHEME

FIELD OF THE INVENTION

The invention is related to computer-readable memory, and in particular, but not exclusively, to an apparatus and method of an adaptive boost converter in a flash memory or random access memory (RAM).

BACKGROUND OF THE INVENTION

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. A split oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array.

BRIEF DESCRIPTION OF THE DRAWINGS

Non-limiting and non-exhaustive embodiments of the present invention are described with reference to the following drawings, in which.

DETAILED DESCRIPTION

Figure 1:
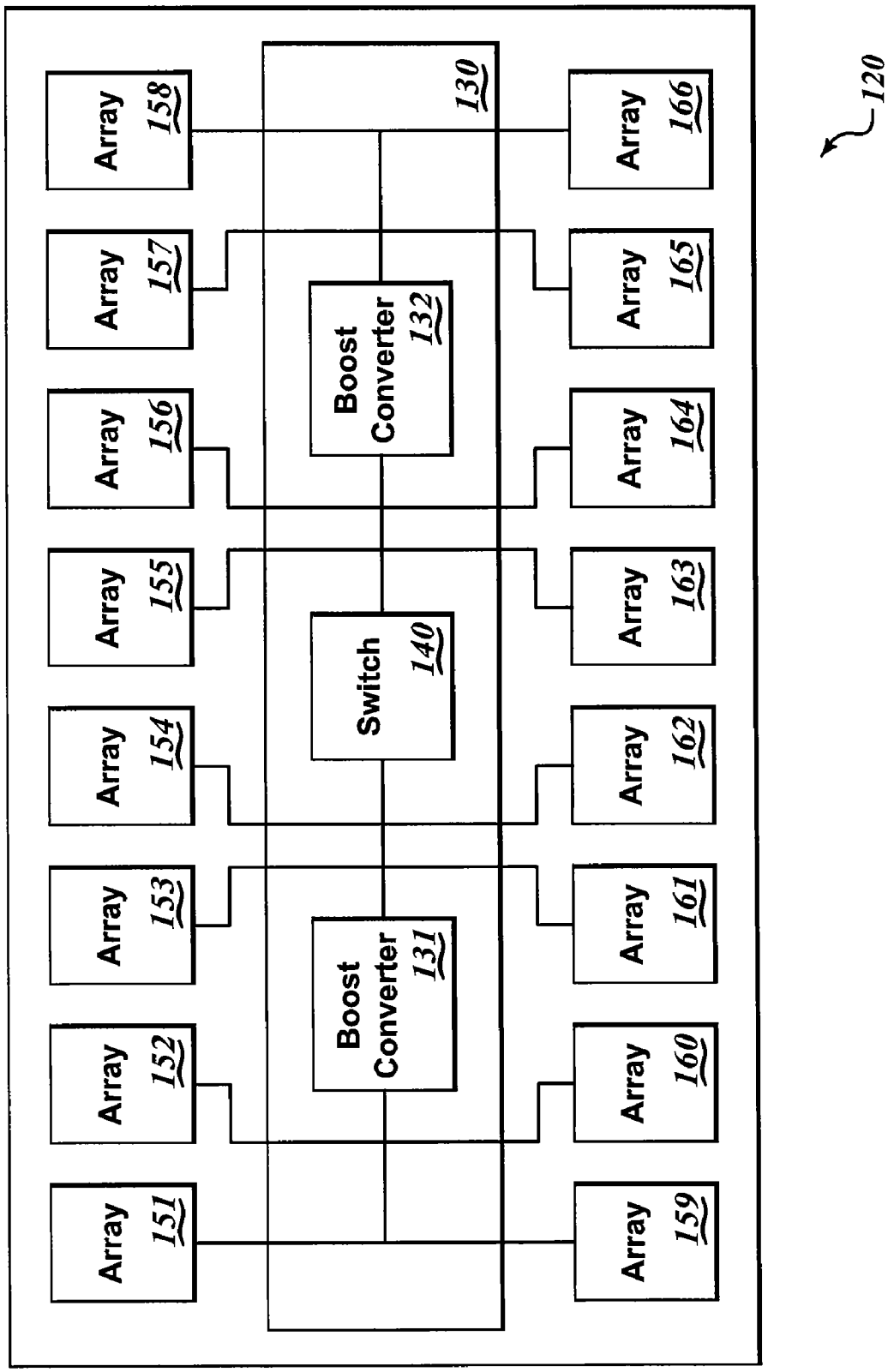
FIG. 1 shows a block diagram of an embodiment of a memory.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

The term "memory cell" as used herein refers to a portion of a memory that is configured to store at least one logic level in a memory. A memory cell can be configured to store a bit or binary datum indicative of a logic level, such as a "0" or a "1." Alternatively, a memory cell can have one of three or more logic levels. In general, a memory cell is typically arrayed with other memory cells to store an amount of data spanning, for example, a Byte, a Kilobyte, Megabyte, Gigabyte, a Terabyte, and larger. Such arrayed memory cells can be arranged in any of a wide variety of volatile and nonvolatile memories, including ROM and RAM. Memory cells can be flash memory cells, such as single-bit, dual-bit, or multi-bit flash memory cells, or can be SRAM, DRAM, EPROM, or EEPROM memory cells.

Briefly stated, the invention is related to a memory that includes memory arrays and boost converter circuitry. The boost converter circuitry provides at least one boosted voltage to each of the memory arrays when the memory array is being accessed. The boosted voltages may include a word line voltage, and/or a pass gate voltage provided to the gates of pass line transistor in a sector decoder and/or an array decoder for the memory cells being accessed. The boost converter circuitry includes at least two boost converters, and a switch. When one of the memory arrays is accessed, the switch either couples the boost converters together or does not couple the boost converters together based on the distance of the memory array being accessed from the boost converters.

FIG. 1 shows a block diagram of an embodiment of memory 120. Memory 120 includes memory arrays 151-166, and boost converter circuitry 130. Memory 120 is a flash memory, synchronous random access memory (SRAM), dynamic random access memory (DRAM), or the like. Further, boost converter circuitry includes boost converter 131, boost converter 132, and switch 140.

Each boost converter (e.g. boost converter 131 and boost converter 132) is a DC-to-DC voltage converter. In one embodiment, each boost converter (e.g. 131, 132) is a charge pump. In other embodiments, the boost converters (e.g. 131, 132) are capacitive-based DC-to-DC step-up converters with no clock signal. For example, in one embodiment, the boosted voltage is provided by first coupling the capacitor between ground and VDD (where VDD acts as the input voltage of the boost converter in this example), and then coupling the end of the capacitor that was coupled to ground to VDD, so that the other end of the capacitor provides an output voltage of the capacitor of 2*VDD. In these embodiments, since the output of the boost converter (e.g. 131, 132) is coupled to the gate of a metal oxide semiconductor FET (MOSFET), no charge is lost, so that a clock signal is not needed.

Each of the memory arrays (151-166) is an array of memory cells. In operation, data accesses to memory cells such as read, write, or erase may occur. In some embodiments, the data access command is accompanied by an address of the memory cell being access, and memory 120 includes an address decoder (not shown) to determine which memory cell in which array is being accessed.

Each time a data access occurs in one of the memory arrays (151-166), boost converter circuitry 130 provides at least one boosted voltage to the memory array being accessed. In some embodiments, the boosted voltage is a word line voltage. In other embodiments, the boosted voltage is a pass gate voltage provided to the gates of pass line transistors in the memory array. In yet other embodiments, one boosted voltage is provided a word line voltage, and another boosted voltage is provided to the gates of pass line transistors in the array (151-166) that is being accessed.

Whenever a data access occurs, switch 140 is closed if the array being accessed is relatively far (physically) from any of the boost converters. When switch 140 is closed, the voltage output of two or more of the boost converters in boost converter circuitry 130 are shorted together to provide the boost voltage to the array being accessed. Conversely, when the array being access is relatively close (physically) to one of the boost converters, switch 140 remains open, and the output of only the boost converter that is physically close to the array being access provides the boosted voltage to the array.

In one embodiment, boost converter circuitry 130 includes only two boost converters (boost converter 131 and boost converter 132) and one switch (140), as shown in the example illustrated in FIG. 1. In this embodiment shown, if array 151, 154, 155, 158, 159, 162, 163, or 166 is being accessed, switch 140 closes, and shorts the output of boost converter 131 to the output of boost converter 132 to provide the boosted output voltage to the array being accessed, since each of these arrays has a relatively far physical routing distance from either boost converter 131 or boost converter 132. Further, in this embodiment, if array 152, 153, 160, or 161 is accessed, switch 140 remains open, and boost converter 131 provides the boosted voltage to the array being accessed, since these arrays each have a physically close routing distance to boost converter 131. Further, in this embodiment, if array 156, 157, 164, or 165 is being accessed, switch 140 remains open, and boost converter 132 provides the boosted voltage to the array being accessed.

In some embodiments, whether to close switch 140 or not may be determined by decoding logic that decodes the address, with the logic being pre-configured based on which array includes the memory cells for that address and whether that array is sufficiently distant from any of the boost converters that the switch should be closed.

In one embodiment, boost converter circuitry 130 includes 2 boost converters and one switch to provide one boosted voltage substantially as described above, to provide the word line voltage, and includes another 2 boost converters and one switch to provide another boosted voltage substantially as described above, to provide a pass gate voltage to the gates of pass line transistors, so that in this embodiment there are 4 boost converters and 2 switches.

In some embodiments, there are two boost converters and one switch per boost voltage provided, as described above. In other embodiments there may be three or more boost converters per boosted voltage provided, with the number of switches being closed depending on how far the array being accessed is from any of the boost converters. Depending on the decoding address, the number of boost converters on depends on the location of the array being selected.

The use of more than one boost converter with shorted outputs when the routing distance is long allows the die size to not be increased while maintaining uniformity in read accesses across all arrays. It would be possible to use only one boost converter with a relatively large capacitor to provide the boosted voltage to all arrays. However, with this approach, because there is short routing to some arrays and long routing to other arrays, the uniformity of read accesses across all arrays would be poor. It would also be possible to use many boost converters with no switching, distributed such that the routing distance to any array is relatively short. However, with this approach, the die size is increased. By providing each boosted voltage with two boost converters, with the total die size of the two boost converters being roughly equal to the die size of the one boost converter if only one boost converter were used, shorting the outputs of the two boost converters together when the routing distance is long, and using only one boost converter when the routing distance is short, the die size is the same as the one large boost converter approach while having the same uniformity of read accesses as the many boost converter approach.

One particular flash memory embodiment operates as follows. In this embodiment, voltage boosting plays 2 roles:
 i). Supplying pass gates voltage.
 ii). Supplying gate voltage for the memory array.

In this particular flash memory embodiment, the placement of voltage boosting circuits in a flash memory integrated circuit (IC) is part of a formula that governs read speed. These two voltages are the backbones of the sensing speed and data reliability. In this particular flash memory embodiment, the pass gate voltage is critical in passing cascode voltage from periphery to global metal 3 bit lines as well as metal 3 bit lines to metal 1 bit lines. This is one of the bottlenecks of a read sensing design. During boosting, if the voltage source is close to the target physically, it is possible to have fast and strong boosted voltage coupling into global metal 3 bit lines causing severe overshot. Alternatively, being too far away may be problematic since resistance and capacitance of the routing causes a time delay. In this embodiment, it is ensured that all of the arrays are supplied with the same ramp rate and voltage level from the boost converters so that the uniformity for read across all the arrays can be well kept, which can be particularly important with greater storage density and chip complexity. In a splitting scheme, since only one array is being accessed at a time (since there is only one set of output IO pins in this particular embodiment), the second set of the boost converter is in a static stage, and can be further utilized as an extra source of charge. In this embodiment, switch 140 is designed so as to avoid forward flow of charges from one side to the other if only one boost converter is needed. Also, in this embodiment, when one boost converter is boosted up, to maintain the high voltage and efficiency, the boosted line is not connected to the second boost converter which is charged at chip operating power while standing by. Further, a decoding mechanism determines whether one or two boost converters are needed. In this embodiment, to avoid overshoot global bit lines and over boost, the array closer to boost converter only uses one boost converter.

Figure 2:
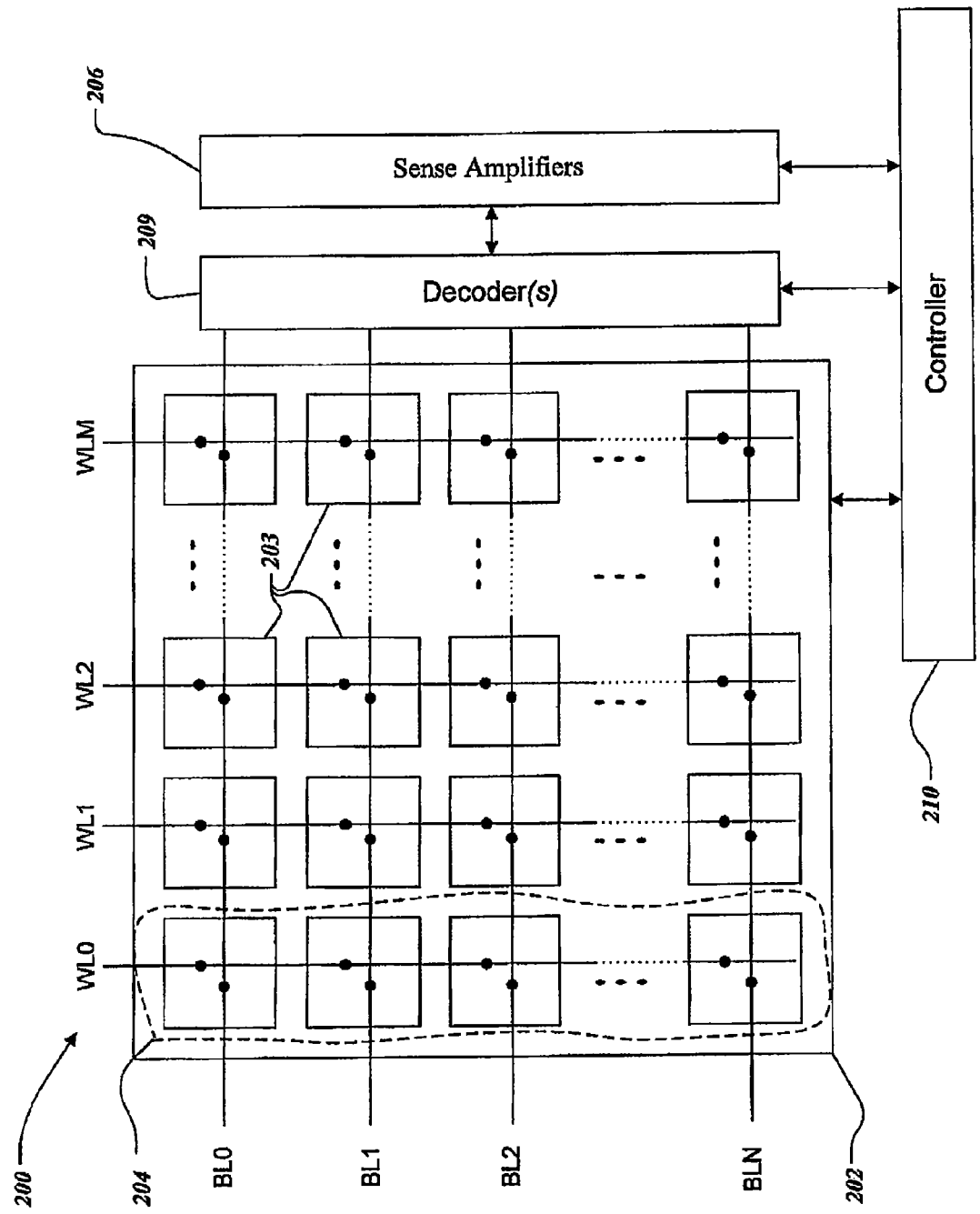
FIG. 2 illustrates a block diagram of an embodiment of a portion of the memory of FIG. 1.

FIG. 2 illustrates a block diagram of an embodiment of a portion (200) of an embodiment of memory 120 of FIG. 1. Portion 200 only includes one array (202) as shown, although the entire memory 120 includes multiple arrays as previously discussed. FIG. 2 shows components of one embodiment of an environment in which the invention may be practiced. Not all the components may be required to practice the invention, and variations in the arrangement and type of the components may be made without departing from the spirit or scope of the invention. As shown, memory 200 of FIG. 2 includes memory array 202 and individual memory cells 203 located within memory array 202. Memory cells 203 are arranged in N+1 rows and M+1 columns in memory array 202. Each row of memory array 202 is accessed by one of bit lines BL0-BLN. Each column of memory array 202 is accessed by one of word lines WL0-WLM. Accordingly, each of memory cells 203 can be accessed by activating a corresponding bit line and a corresponding word line of the cell. In one embodiment, each column of memory array 202 defines a data word. If N+1 has a value of 8, for example, the cells in each column of memory array 202 define a byte of data.

Memory 200 can also include sense amplifiers 208, decoder(s) 209, and memory controller 210. Sense amplifiers 208 are configured to provide read data by comparing the reference signal to sensed signals from individual memory cells 203. For example, when word line WL0 is activated, sense amplifiers 208 can provide read data corresponding to each of the memory cells in column 204 or a portion of the memory cells in column 204. Sense amplifiers 208 are also configured to write individual memory cells 203. For example, sense amplifiers 208 can provide separate write signals to each of the memory cells in column 204 or a portion of the memory cells in column 204 to write a logic state to these memory cells.

Decoder(s) 209 is configured to selectively couple individual sense amplifiers 208 to individual memory cells 203 for reading and/or writing. In one embodiment, decoder(s) 209 includes a sector decoder. As such, decoder(s) 209 may be arranged to selectively couple individual sense amplifiers 208 to a particular column or grouping of columns within memory 200. For example, a grouping of columns may define a sector, and another grouping of columns may define another sector. In another embodiment, memory 200 may include an array decoder for selectively coupling sense amplifiers 208 to memory array 204 or another array of memory 200 (not shown). For example, decoder(s) 209 may form a portion of such an array decoder. In addition, embodiments of array decoders can be configured to work separately or in conjunction with a sector decoder.

Memory controller 210 is configured to drive the various components of memory 200, including sense amplifiers 208, and decoder(s) 209. Memory controller 210 is also configured to activate and de-activate individual word lines WL0-WLM for reading and/or writing to memory array 202. For example, memory controller 210 can provide a select signal to one of the columns WL1-WLM to activate that column. In some embodiments, only one word line voltage WL0-WLM is on at a time, and the word line voltage is the boosted voltage provided by boost converter circuitry 130 of FIG. 1. Further, in some embodiments, memory controller 210 can provide a select signal to decoder(s) 209 for selecting a particular one or rows BL0-BLN (or sector) to be written to or read from.

In general, embodiments of memory 200 can be configured differently. For example, components may be added to or omitted from memory 200 and/or components may be combined in memory 200. In one embodiment, word lines WL0-WLM may be arranged in rows (instead of columns), and bit lines BL0-BLN may be arranged in columns (instead of rows). Further, other arrangements of bit lines and word lines are possible. In the embodiment shown in FIG. 2, an individual one of memory cells 203 is typically referred to as a two terminal memory cell because it is coupled to one word line and one bit line. In another embodiment, an individual memory cell can have three terminals, for example, if such a memory cell is coupled to one word line and two bit lines. Further, embodiments of memory cells 203 can be configured to receive any of a wide variety of current and/or voltage signals for reading and/or writing to individual memory cells. In one embodiment, a memory cell can receive a specific level of current or voltage for reading and/or writing to the memory cell. In another embodiment, a memory cell can receive a combination of current and voltage signals for reading and/or writing the memory cell.

In one embodiment, memory controller 210 includes an address decoder that determines which cell in which array is being accessed whenever a data access occurs. Memory controller 210 also controls switch 140 of FIG. 1. Memory controller 210 includes a switch control circuit that is arranged to, for each data access of one of the arrays (e.g. array 151-166 of FIG. 1), control opening and closing of switch 140 of FIG. 1 such that switch 140 is opened or closed based on distance of the array being accessed from the boost converters in boost converter circuitry 130. In one embodiment, the switch control circuit in memory controller 210 includes decoding logic that determines whether to close switch 140 by decoding the address, with the logic being pre-configured based on which array includes that address and whether that array is sufficiently distant from any of the boost converters that switch 140 should be closed.

In one embodiment, the word line voltages (WL1-WLM) provided is a boosted voltage provided by boost converter circuitry 130 of FIG. 1. In one embodiment, decoder(s) 209 includes a sector decoder, an array decoder, or both, where the sector decoder and or array decoder includes pass line transistors, and wherein the pass gate voltage provided to the pass line transistors is the boosted voltage provided by boost circuitry 130 of FIG. 1.

Figure 3:
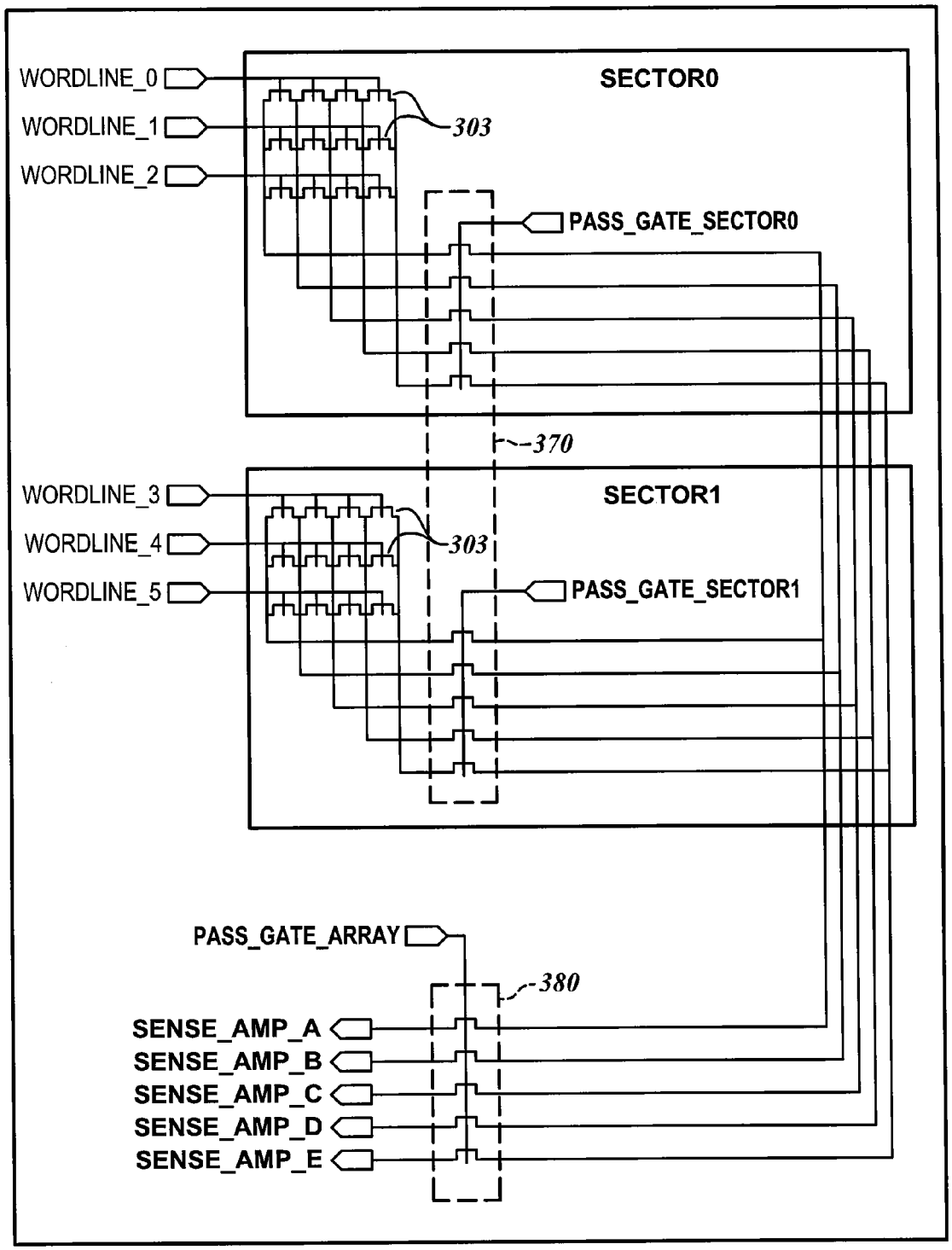
FIG. 3 shows a schematic diagram of an embodiment of a portion of the memory of FIG. 2.

FIG. 3 shows a schematic diagram of an embodiment of a portion (305) of portion 200 of a memory of FIG. 2. Portion 305 includes memory cells 303, a portion (370) of a sector decoder (e.g. of decoder(s) 209 of FIG. 2) and a portion (380) of an array decoder (e.g. of decoder(s) 209 of FIG. 2). Although FIG. 3 illustrates a MirrorBit™ flash memory, the invention is not so limited, and other types of memory may also be employed.

In some embodiments, when a data access occurs, the array decoder provides the boosted pass gate voltage to the gates of the pass lines transistors for particular array in which that address resides (for example, providing the boosted voltage to PASS_GATE_ARRAY when the array illustrated is accessed), and in that array, the sector decoder provides the boosted pass gate voltage to the gate of the pass line transistor for the particular sector in which that address resides (for example, providing the boosted voltage to PASS_GATE_SECTOR0 if the address is in SECTOR 0, or providing the boosted voltage to PASS_GATE_SECTOR1 if the address is in SECTOR 1).

In one embodiment, portion 305 is a portion of a Mirror-Bit™ flash memory that is arranged as follows. Portion 370 of the sector decoder includes MOSFETs that connect the metal 1 bit liens to metal 2 bit lines for the sector that is actively selected. Only 1 set of sector decoder/pass gate, the one for that sector, receives the boosted voltage at a time for the whole array (the set for whichever sector is being accessed). The metal 1 bit lines travel only within the sector and is used to connect all the sources and drain terminals of all of the core cells 303 together to form an array. The metal 2 bit lines travel across the whole array (all of the sectors in the array). Portion 380 of the array decoder includes MOFETS that connect the metal 2 bit lines to sense amplifiers 206 of FIG. 2 if one of that sectors in that array is selected.

Portion 305 is only a portion of memory—only a small number of word lines and core cells are shown in the array, where an entire array will typically include many more word lines and core cells than shown in portion 305.

A variety of simulation and/or software tools may be employed to create a specific implementation of the memory. High-level software code, such as a register transfer logic (RTL) file, may be created and then compiled to form a netlist file. A physical design process may be employed in conjunction with the netlist file and a component library to create a layout file. The layout file may be used to create a mask file that may be provided to a device foundry to equip the foundry for manufacturing the memory.

Figure 4:
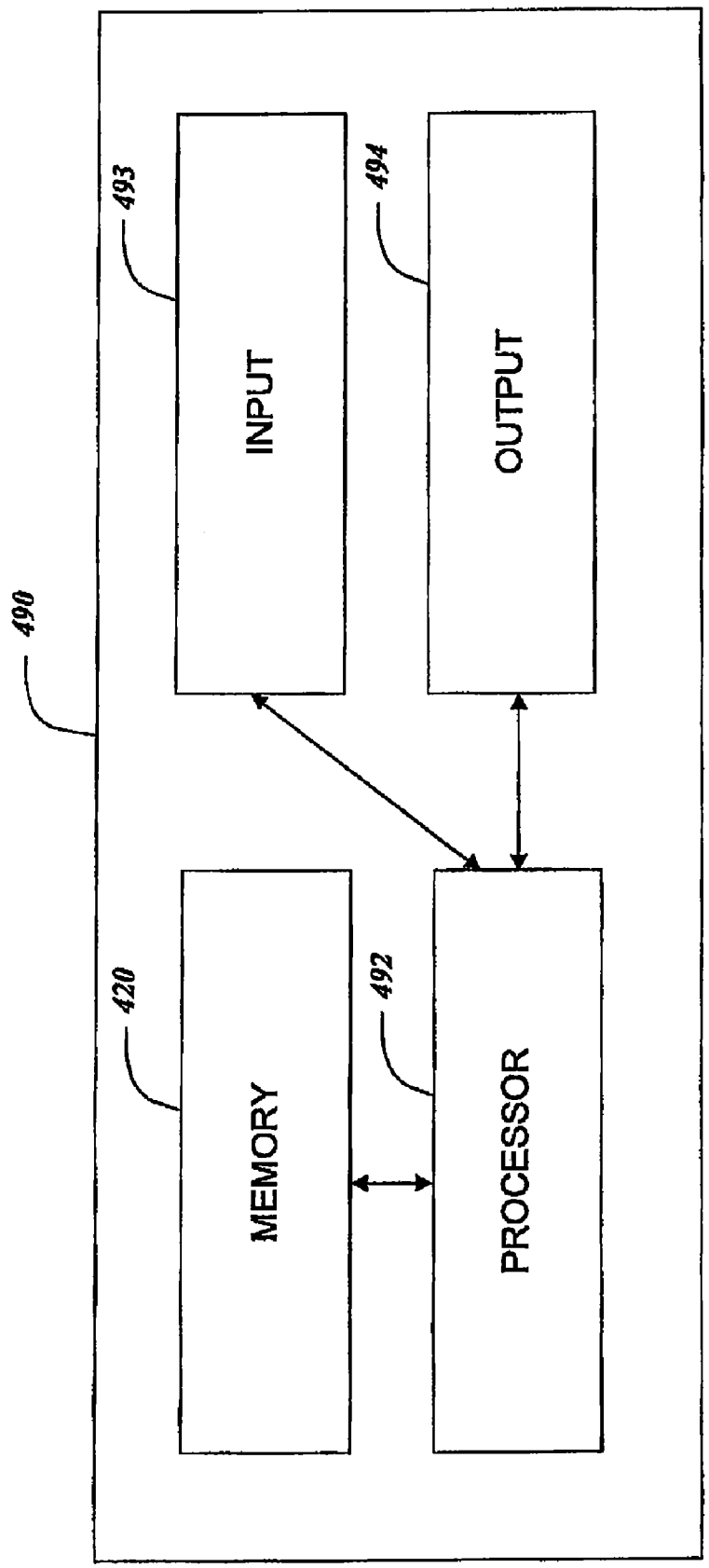
FIG. 4 illustrates block diagram of a system that includes an embodiment of the memory of FIG. 1, arranged in accordance with aspects of the invention.

Embodiments of memory 120 of FIG. 1 can be incorporated into any of a variety of components and/or systems, including for example, a processor and other components or systems of such components. FIG. 4 shows one embodiment of system 490, which may incorporate memory 420, which is an embodiment of memory 120 of FIG. 1. Memory 420 may include, for example, any one of the aforementioned memories, such as single-bit, dual-bit, or multi-bit flash memory, SRAM, or DRAM. Memory 1401 can be directly or indirectly connected to any one of processor 492, input devices 493, and/or output devices 494. In one embodiment, memory 420 may be configured such that it is removable from system 490. In another embodiment, memory 420 may be permanently connected to the components or a portion of the components of system 490.

In many embodiments, memory 420, processor 492, input devices 493, and/or output devices 494 of system 490 are configured in combination to function as part of a larger system. For example, system 490 may be incorporated into a cell phone, a handheld device, a laptop computer, a personal computer, and/or a server device. In addition or alternatively, system 490 can perform any of a variety of processing, controller, and/or data storage functions, such as those associated with sensing, imaging, computing, or other functions. Accordingly, system 490 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A memory device, comprising:
a memory including a plurality of arrays, wherein each of the plurality of arrays is arranged to receive a boost voltage;
boost converter circuitry that is arranged to provide the boost voltage, wherein the boost converter circuitry includes:
a plurality of boost converters including a first boost converter having at least an output and a second boost converter having at least an output; and
a switch that is arranged to couple the output of the first boost converter to the output of the second boost converter if the switch is closed, and to de-couple the output of the first boost converter from the output of the second boost converter if the switch is open; and
a switch control circuit that is arranged to, for each data access of one of the arrays of the plurality of arrays, control opening and closing of the switch such that the switch is opened or closed based on distance of the array being accessed from the plurality of boost converters.

2. The memory device of claim 1, wherein
each of the plurality of arrays is arranged such that the boost voltage is the word line voltage for the array.

3. The memory device of claim 1, further comprising:
an array decoder, wherein the array decoder includes a set of pass line transistors in each array of the plurality of arrays, wherein for each array, each pass line transistor of the set of pass line transistors in the array is arranged to receive the boost voltage at the gate of the pass line transistor when the array is being accessed.

4. The memory device of claim 1, wherein
each of the plurality of arrays includes a sector decoder, wherein the sector decoder includes a set of pass line transistors in each sector of a plurality of sectors, wherein, for each sector, each pass line transistor in the set of pass line transistors in the sector is arranged to receive the boost voltage at the gate of the pass line transistor when the sector is being accessed.

5. The memory device of claim 1, wherein
the switch control circuit includes decoding logic that determines whether to open or close the switch by decoding the address being accessed by the data access, wherein the decoding logic is pre-configured based on, for each address, which array includes that address and the distance of that array from each of the boost converters in the boost converter circuitry.

6. The memory device of claim 1, wherein
the switch is arranged to short the output of the first boost converter to the output of the second boost converter if the switch is closed, and wherein the switch control circuit is arranged to close the switch if a data access occurs to one of the plurality of array and the array being accessed by the data access has a relatively long routing distance from each of the boost converters in the boost converter circuitry.

7. The memory device of claim 1, wherein
the boost converter circuitry includes exactly two boost converters for each boosted voltage provided by the boost converter circuitry.

8. The memory device of claim 1, wherein:
the memory includes means for storing data; or
the boost converter includes means for generating the boost voltage from an input voltage such that the boost voltage is greater than the input voltage; or
the switch includes means for selectively coupling the output of the first boost converter to the output of the second boost converter.

9. A memory device, comprising:
a memory including an array decoder and a plurality of arrays, wherein each of the plurality of arrays includes a sector decoder and a plurality sectors, and wherein each of the sectors includes a plurality of core memory cells;

a memory controller, wherein the memory controller includes an address decoder that is arranged such that, a command for a read access having an address for the data address is received, the address decoder determines which core memory cells correspond to the address;

a first boost converter circuit that is arranged to provide a first boost voltage, wherein the memory controller is arranged such that, when a command for a read access is received, the first boost voltage is provided to the memory as the word line address for the core memory cell being accessed, and wherein the first boost converter circuit includes:

a first boost converter having at least an output;

a second boost converter having at least an output; and a first switch that is arranged to short the output of the first boost converter to the output of the second boost converter if the first switch is closed, and to de-couple the output of the first boost converter from the output of the second boost converter if the first switch is open; and a second boost converter circuit that is arranged to provide a second boost voltage, wherein the second boost voltage is a pass gate voltage for the array decoder, the second boost voltage is a pass gate voltage for the sector decoder, and wherein the second boost converter circuit includes:

a third boost converter having at least an output;

a fourth boost converter having at least an output; and a second switch that is arranged to short the output of the third boost converter to the output of the fourth boost converter if the second switch is closed, and to de-couple the output of the third boost converter from the output of the fourth boost converter if the second switch is open, wherein the memory controller further includes a switch control circuit that is arranged to, for each data access of one of the arrays of the plurality of arrays, control opening and closing of the first switch and the second switch such that the first switch and the second switch are each opened or closed based on distance of the array being accessed from the plurality of boost converters.

10. A method for memory access, comprising:

receiving a command for data access for a memory array of a plurality of memory arrays;

determining whether or not to short the output of a boost converter of a plurality of boost converters to the output of another boost converter in the plurality of boost converters based on the routing distance from each of the boost converters in the plurality of boost converters to the memory array; and providing a boosted voltage, such that the boosted voltage is provided by shorting the output of the first boost converter to the output of the second boost converter if the determination to short the output of the boost converter to the other boost converter is positive.

* * * * *

UNITED STATES PATENT AND TRADEMARK OFFICE
CERTIFICATE OF CORRECTION

PATENT NO.        : 8,094,509 B2
APPLICATION NO.   : 12/262123
DATED             : January 10, 2012
INVENTOR(S)       : Chin-Ghee Chng et al.

It is certified that error appears in the above-identified patent and that said Letters Patent is hereby corrected as shown below:

In column 6, line 44, delete "and or" and insert -- and/or --, therefor.

In column 7, line 12, delete "MOFETS" and insert -- MOSFETS --, therefor.

Signed and Sealed this
Third Day of July, 2012

David J. Kappos
*Director of the United States Patent and Trademark Office*